(12) United States Patent
Yun

(10) Patent No.: US 7,977,191 B2
(45) Date of Patent: Jul. 12, 2011

(54) METHOD FOR FABRICATING FLASH MEMORY DEVICE

(75) Inventor: Ki-Jun Yun, Suwon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 32 days.

(21) Appl. No.: 12/647,497

(22) Filed: Dec. 27, 2009

(65) Prior Publication Data

US 2010/0167515 A1    Jul. 1, 2010

(30) Foreign Application Priority Data

Dec. 30, 2008 (KR) .................. 10-2008-0136473

(51) Int. Cl.
 *H01L 21/336* (2006.01)

(52) U.S. Cl. ........ 438/267; 438/257; 438/258; 438/259; 438/261; 438/265; 438/266

(58) Field of Classification Search .......... 438/257–259, 438/261, 265–267
See application file for complete search history.

(56) References Cited

U.S. PATENT DOCUMENTS

| | | | |
|---|---|---|---|
| 6,774,428 B1 * | 8/2004 | Hung et al. | 257/315 |
| 6,821,849 B2 * | 11/2004 | Chang et al. | 438/266 |
| 7,259,422 B1 * | 8/2007 | Hisamoto et al. | 257/316 |
| 7,745,872 B2 * | 6/2010 | Shone | 257/316 |
| 2006/0019445 A1 * | 1/2006 | Chen | 438/257 |
| 2006/0170038 A1 * | 8/2006 | Wong et al. | 257/330 |
| 2006/0205154 A1 * | 9/2006 | Hung et al. | 438/257 |
| 2007/0108504 A1 * | 5/2007 | Lee et al. | 257/316 |
| 2008/0142876 A1 * | 6/2008 | Arigane et al. | 257/324 |

* cited by examiner

*Primary Examiner* — Kevin M Picardat
*Assistant Examiner* — Bac H Au
(74) *Attorney, Agent, or Firm* — Sherr & Vaughn, PLLC

(57) ABSTRACT

A method of forming a flash memory device includes forming a plurality of memory gates over a semiconductor substrate, forming an oxide film over the uppermost surface and sidewalls of the memory gates and then forming a plurality of selective gates on sidewalls of each of the memory gates.

20 Claims, 4 Drawing Sheets

METHOD FOR FABRICATING FLASH MEMORY DEVICE

Figure 1A:
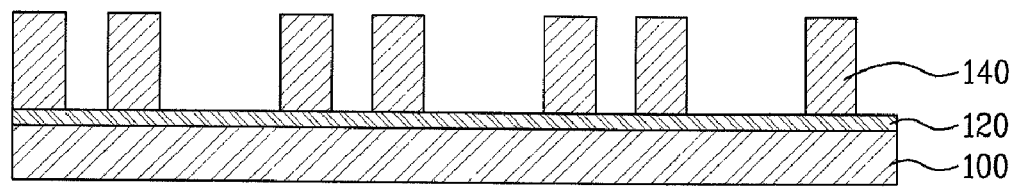

The present application claims priority under 35 U.S.C. §119 to Patent Korean Application No. 10-2008-0136473 (filed on Dec. 30, 2008), which is hereby incorporated by reference in its entirety.

BACKGROUND

Development of non-volatile memory devices which do not lose data even if supply of power is stopped is rapidly progressing. An example of such a non-volatile memory devices includes an EEPROM having a single poly structure, an EEPROM having a dual poly structure, a flash memory device having a stacked gate structure, a flash memory device having a separate gate structure, or a flash memory device having an SONOS structure.

Of fields of application of the non-volatile memory devices, an embedded flash memory device having a combined logic and memory can be fabricated by a process in which a floating gate and a control gate are formed in one chip at a time, has wide application and can be developed using existing equipment without requiring high technologies. In view of characteristics of the embedded flash memory device, profiles after etchings for forming gates are very important, such that a process for forming the profile of a selective gate which serves as a control gate is also one of important factors. This is because the selective gate is closely related with source/drain regions which are to be formed in a later process in fixing electric characteristics of the source/drain.

However, the embedded flash memory device has a problem in that it requires a very large thickness of a memory gate formed in a prior process for enlarging a cross-sectional area of the selective gate.

SUMMARY

Embodiments are related to a flash memory device and a method for fabricating a flash memory device which reduces overall device size.

In accordance with embodiments, a method for fabricating a flash memory device can include at least one of the following: forming an ONO film on and/or over a semiconductor substrate, forming a memory gate on and/or over the ONO film, forming a gate oxide film on and/or over an upper portion and sidewalls of the memory gate, forming first polysilicon for selective gate on and/or over an entire surface of the semiconductor substrate including the memory gate, forming second polysilicon on and/or over an entire surface of the first polysilicon additionally, etching the first polysilicon and a portion of the second polysilicon for flattening the first polysilicon and the second polysilicon, and selectively etching a region of the first polysilicon to form a selective gate.

In accordance with embodiments, a method for fabricating a flash memory device can include at least one of the following: forming an insulating film having a multilayered structure over a semiconductor substrate; forming a memory gate over the insulating film; forming a gate oxide film over the uppermost surface and sidewalls of the memory gate; forming a first polysilicon layer over an entire surface of the semiconductor substrate including the memory gate and the gate oxide film; forming second polysilicon layer over an entire surface of the first polysilicon layer; performing a first etching process on the first polysilicon and the second polysilicon; and then forming selective gates by performing a second etching process on the first polysilicon layer.

In accordance with embodiments, a method for fabricating a flash memory device can include at least one of the following: forming an insulating film over and a semiconductor substrate; forming a plurality of memory gates spaced apart over the insulating film by forming a first polysilicon layer over the insulating film and then performing a first etching process on the first polysilicon film; forming a gate oxide film over the uppermost surface and sidewalls of the memory gate by performing an oxidation process; forming a second polysilicon layer over the insulating layer, the memory gates and the gate oxide film; forming third polysilicon layer over the uppermost surface of the second polysilicon layer; performing a second etching process on the first polysilicon and the second polysilicon; and then forming a plurality of selective gates in the spaces between neighboring memory gates by performing a third etching process on the first polysilicon layer.

In accordance with embodiments, a method for fabricating a flash memory device can include at least one of the following: forming a first insulating film over and a semiconductor substrate; forming a plurality of memory gates over the first insulating film; forming a second insulating film over the uppermost surface and sidewalls of respective one of the memory gates by performing an oxidation process; forming a first polysilicon layer over the first insulating film, the memory gates and the second insulating film such that the first polysilicon layer has a plurality of grooves formed in an uppermost surface thereof; forming a second polysilicon layer over the uppermost surface of the first polysilicon layer to fill the grooves in the first polysilicon layer; simultaneously removing the second polysilicon layer and planarizing the uppermost surface of the first polysilicon; and then forming a plurality of selective gates on sidewalls of each of the memory gates by etching the second polysilicon layer.

DRAWINGS

Example FIGS. 1A to 1F illustrate a method for fabricating a flash memory device, in accordance with embodiments.

Figure 2:
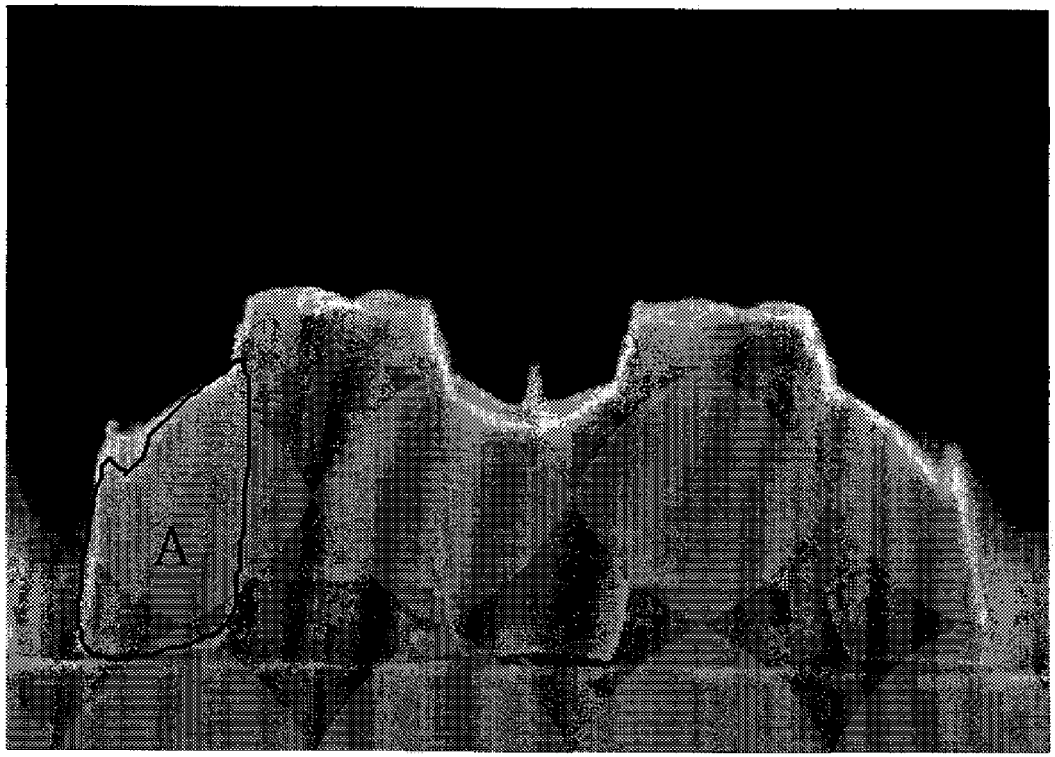

FIG. 2 illustrates a flash memory device.

DESCRIPTION

Reference will now be made in detail to embodiments, examples of which are illustrated in the accompanying drawings. Wherever possible, the same reference numbers will be used throughout the drawings to refer to the same or like parts. A system and operation of embodiments shown in drawings and described with reference thereto is described. However, the description does not limit a technical aspect and essential system and operation of embodiments.

As illustrated in example FIG. 1A, after forming a pad oxide film on and/or over semiconductor substrate 100 for suppressing crystalline defects of an upper surface and providing surface treatment of semiconductor substrate 100, a nitride film is formed on and/or over the pad oxide film to form a hard mask film having the pad oxide film and the nitride film stacked in succession. After coating photoresist on and/or over an entire surface of semiconductor substrate 100 including the nitride film, exposure and development is performed to form a photoresist pattern which exposes a surface of an oxide film at which a device isolation film is to be formed by exposure and development.

The pad oxide film and the nitride film are selectively removed from an exposed region using the photoresist pattern as an etch mask, to form a hard mask film pattern having a pad oxide film pattern and a nitride film pattern. The photoresist pattern is then removed, and an exposed surface of semiconductor substrate 100 is etched to a depth using the hard mask film pattern as an etch mask to form a trench. In this instance, a sacrificial oxide film may be formed in the trench by dry oxidation for compensating for etch damage at sidewalls and a bottom of the trench, rounding upper sides and bottom corners of the trench, and reducing critical dimension CD of an active region.

After forming the trench, a burying insulating film is formed on an entire surface of semiconductor substrate 100 to bury the trench, and is subjected to CMP to flatten the burying insulating film, to form a device isolating film which defines an active region and a device isolating region of semiconductor substrate 100. A well is formed in the active region of semiconductor substrate 100 having the active region and the device isolating region defined by the device isolating film. ONO (Oxide/Nitride/Oxide) film 120 is then formed on and/or over an entire surface of semiconductor substrate 100. A first polysilicon film for memory gate is then formed on and/or over an entire surface of the semiconductor substrate 100. A photoresist is then coated on and/or over the first polysilicon film and subjected to patterning with exposure and development, to form a photoresist pattern which exposes a region excluding a memory gate forming region. The first polysilicon is etched by using the photoresist pattern as an etch mask to form a plurality of memory gates 140.

Figure 1B:
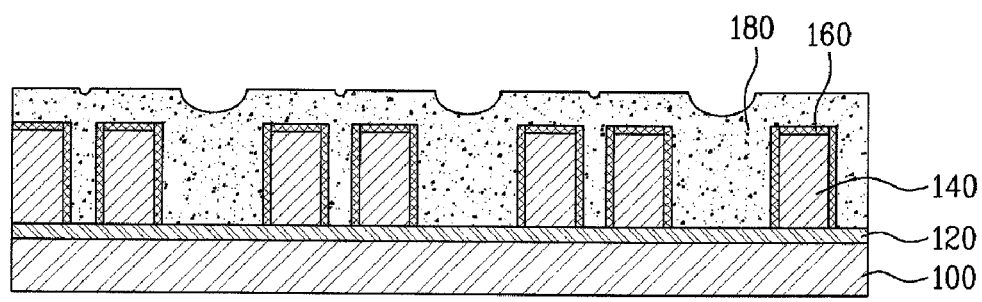

As illustrated in example FIG. 1B, an oxidation process is then performed to form gate oxide film 160 on and/or over an uppermost surface and side walls of memory gates 140. Second polysilicon 180 for forming a selective gate is formed on and/or over an entire surface of semiconductor substrate 100 including oxide film 160. Depending on distances between memory gates 140, second polysilicon 180 has round grooves formed in spaces between neighboring memory gates 140.

Figure 1C:
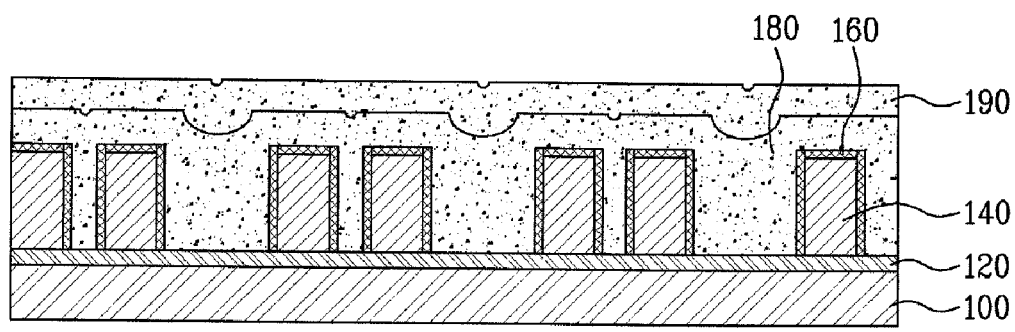

As illustrated in example FIG. 1C, in order to minimize and remove the round grooves, third polysilicon 190 is deposited on and/or over second polysilicon 180 including the grooves.

Figure 1D:
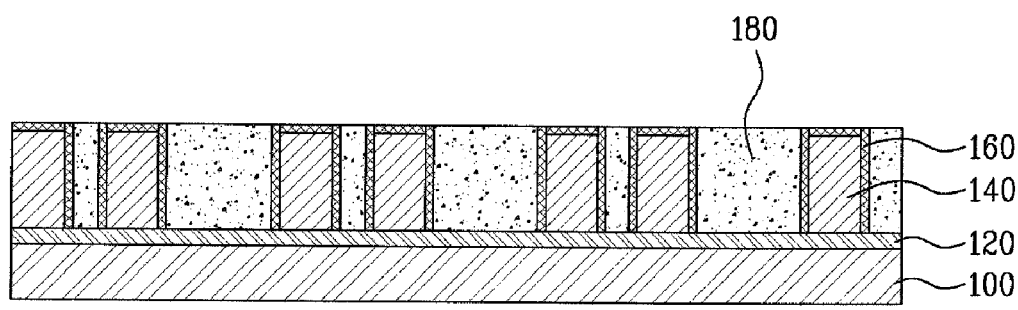

Referring to FIG. 1D, a portion of second polysilicon 180 and all of third polysilicon 190 is etched back by plasma dry etching to planarize the surface of second polysilicon 180 such that second polysilicon 180 has a thickness equal to the thickness of memory gates 140. Meaning, third polysilicon 190 is removed completely, and second polysilicon 180 has a shape filled in gaps between memory gates 140.

Figure 1E:
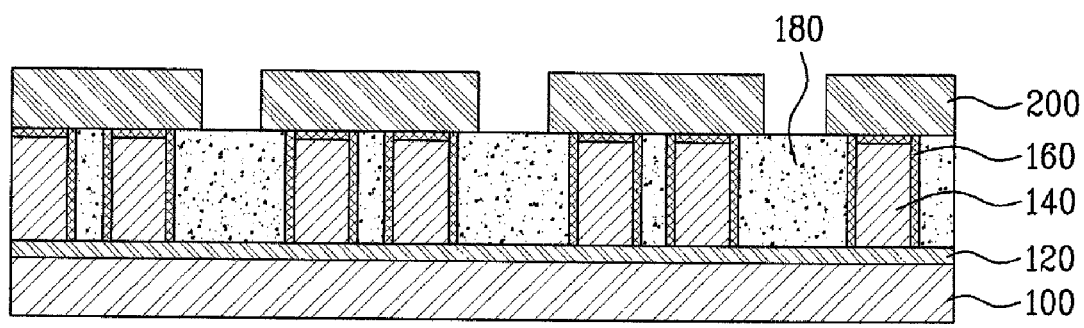

As illustrated in example FIG. 1E, photoresist is coated on and/or over an entire surface of second polysilicon 180, and patterned with exposure and development to form photoresist pattern 200 which exposes a region excluding a region where a selective gate is to be formed.

Figure 1F:
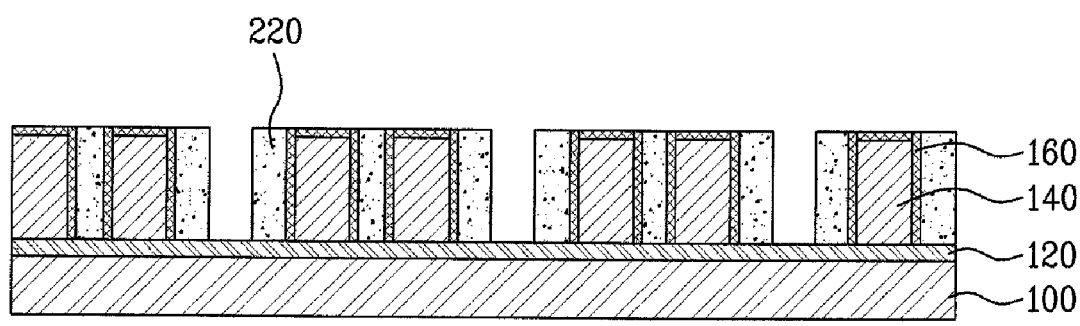

As illustrated in example FIG. 1F, second polysilicon 180 is etched selectively using photoresist pattern 200 as an etch mask to form a plurality of selective gates 220 at side walls of each memory gate 140. The uppermost surface of selective gates 220 are formed substantially coplanar relative to the uppermost surface of oxide film 160 formed on and/or over the uppermost surface of a corresponding memory gates 140. Successive steps are then performed to complete fabrication of the flash memory device.

Although general embedded flash memory has polysilicon with steep slopes after etching the selective gate due to nature of the steps, which steep slope reduces an area of the selective gate, embodiments can minimize formation of the steep slope at the selective gate. This permits an adequate area of the selective gate and a lower thickness of the memory gate that in turn enables a reduction in overall device size. Moreover, by securing a cross-sectional area and a profile of the selective gate, the reduction in thickness of the memory gate permits an adequate patterning process margin.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    forming an insulating film having a multilayered structure over a semiconductor substrate;
    forming a memory gate over the insulating film;
    forming a gate oxide film over the uppermost surface and sidewalls of the memory gate;
    forming a first polysilicon layer over an entire surface of the semiconductor substrate including the memory gate and the gate oxide film;
    forming a second polysilicon layer over an entire surface of the first polysilicon layer;
    performing a first etching process on the first polysilicon and the second polysilicon; and then
    forming selective gates by performing a second etching process on the first polysilicon layer.

2. The method of claim 1, wherein forming the first polysilicon layer comprises forming a plurality of grooves in the first polysilicon layer.

3. The method of claim 2, wherein forming the second polysilicon layer comprises forming the second polysilicon layer to fill the grooves in the first polysilicon layer.

4. The method of claim 1, wherein performing the first etching process comprises performing an etch back process.

5. The method of claim 4, wherein performing the etch back process comprises performing a plasma dry etching.

6. The method of claim 1, wherein performing the first etching process comprises completely removing the second polysilicon layer and planarizing the first polysilicon layer.

7. The method of claim 6, wherein performing the first etching process comprises etching the first polysilicon layer to have the same thickness as the memory gate.

8. The method of claim 1, wherein forming selective gates comprises forming a selective gate on each side wall of the memory gate.

9. The method of claim 1, wherein the uppermost surface of the selective gates are formed substantially coplanar to the uppermost surface of the gate oxide film formed over the uppermost surface of the memory gate.

10. The method of claim 1, wherein the insulating film comprises an Oxide-Nitride-Oxide film.

11. The method of claim 1, wherein forming a gate oxide film comprises forming the gate oxide film to directly contact the uppermost surface and sidewalls of the memory gate.

12. A method comprising:
    forming a plurality of memory gates spaced apart over a semiconductor substrate by forming a first polysilicon layer over the semiconductor substrate and then performing a first etching process on the first polysilicon film;
    forming a gate oxide film over the uppermost surface and sidewalls of the memory gates by performing an oxidation process;

forming a second polysilicon layer over the semiconductor substrate, the memory gates and the gate oxide film;

forming a third polysilicon layer over the uppermost surface of the second polysilicon layer;

performing a second etching process on the second polysilicon and the third polysilicon; and then forming a plurality of selective gates in the spaces between neighboring memory gates by performing a third etching process on the second polysilicon layer.

13. The method of claim 12, wherein forming the second polysilicon layer comprises forming a plurality of grooves in the uppermost surface of the second polysilicon layer.

14. The method of claim 13, wherein forming the third polysilicon layer comprises forming the third polysilicon layer to fill the grooves in the second polysilicon layer.

15. The method of claim 12, wherein performing the second etching process comprises completely removing the third polysilicon layer and planarizing the surface of the second polysilicon layer.

16. The method of claim 12, wherein forming the plurality of selective gates comprises forming a selective gate on each sidewall of the memory gate.

17. The method of claim 12, wherein forming the plurality of selective gates comprises forming one of the selective gates to completely fill a space between neighboring memory gates.

18. The method of claim 12, wherein the second etching process comprises an etch back process.

19. The method of claim 12, wherein forming a gate oxide film comprises forming the gate oxide film to directly contact the uppermost surface and sidewalls of the memory gate.

20. A method comprising:

forming a first insulating film over a semiconductor substrate;

forming a plurality of memory gates over the first insulating film;

forming a second insulating film over the uppermost surface and sidewalls of respective one of the memory gates by performing an oxidation process;

forming a first polysilicon layer over the first insulating film, the memory gates and the second insulating film such that the first polysilicon layer has a plurality of grooves formed in an uppermost surface thereof;

forming a second polysilicon layer over the uppermost surface of the first polysilicon layer to fill the grooves in the first polysilicon layer;

simultaneously removing the second polysilicon layer and planarizing the uppermost surface of the first polysilicon; and then forming a plurality of selective gates on sidewalls of each of the memory gates by etching the first polysilicon layer.

\* \* \* \* \*